United States Patent
Nishi et al.

(10) Patent No.: US 7,075,017 B2
(45) Date of Patent: Jul. 11, 2006

(54) WIRING CIRCUIT BOARD

(75) Inventors: Kensuke Nishi, Ibaraki (JP); Yasuto Ishimaru, Ibaraki (JP)

(73) Assignee: Nitto Denko Corporation, Ibaraki (JP)

( * ) Notice: Subject to any disclaimer, the term of this patent is extended or adjusted under 35 U.S.C. 154(b) by 21 days.

(21) Appl. No.: 11/014,393

(22) Filed: Dec. 16, 2004

(65) Prior Publication Data

US 2005/0139387 A1 Jun. 30, 2005

(30) Foreign Application Priority Data

Dec. 16, 2003 (JP) ............................. 2003-418157

(51) Int. Cl.
*H05K 1/11* (2006.01)
(52) U.S. Cl. ...................... 174/261; 174/260
(58) Field of Classification Search ................ 174/260, 174/261, 250; 257/778, 779
See application file for complete search history.

(56) References Cited

U.S. PATENT DOCUMENTS

| | | | |
|---|---|---|---|
| 6,072,126 A | 6/2000 | Shiga et al. | |
| 6,143,991 A * | 11/2000 | Moriyama | 174/261 |
| 6,169,253 B1 * | 1/2001 | Jairazbhoy et al. | 174/250 |
| 6,281,450 B1 * | 8/2001 | Urasaki et al. | 174/261 |
| 6,384,344 B1 * | 5/2002 | Asai et al. | 174/261 |
| 6,512,182 B1 * | 1/2003 | Takeuchi et al. | 174/256 |
| 6,528,734 B1 * | 3/2003 | Mizunashi | 174/255 |
| 6,740,822 B1 * | 5/2004 | Watanabe | 174/260 |
| 6,809,415 B1 * | 10/2004 | Tsukada et al. | 257/693 |
| 2002/0033532 A1 | 3/2002 | Wu et al. | |

FOREIGN PATENT DOCUMENTS

| | | |
|---|---|---|
| JP | 02-260596 A | 10/1990 |
| JP | 04-014892 A | 1/1992 |
| JP | 2002-204055 A | 7/2002 |

* cited by examiner

*Primary Examiner*—Hung V. Ngo
(74) *Attorney, Agent, or Firm*—Leydig, Voit & Mayer, Ltd.

(57) ABSTRACT

At least a particular part of a strip conductor 2 of a wiring circuit board for mounting, wherein the strip conductor is exposed to form a stripe pattern, so that individual conductor can be connected to electrode E of an electronic component, is covered with a solder resist 3. The particular part is one section in the longitudinal direction of a strip conductor having a long end, which section includes an area overlapping an electrode which is connected to a short end and transferred in parallel in the strip width direction up to the position on the strip conductor having a long end. As a result, a structure capable of suppressing a short circuit between an electrode and a wiring pattern can be afforded to a wiring circuit board, even to an electronic component having an electrode formed in high-density and in a zigzag arrangement pattern, which comprises an area overlapping an electrode.

7 Claims, 8 Drawing Sheets

WIRING CIRCUIT BOARD

FIELD OF THE INVENTION

The present invention relates to a wiring circuit board having a terminal to be directly connected to an electrode of an electronic component such as a semiconductor element and the like so as to mount the electronic component.

BACKGROUND OF THE INVENTION

Semiconductor elements such as IC and the like are generally formed in a great number on a wafer, diced into individual chips and connected to various circuit boards for use. By further integration of IC at a large scale, the number of electrodes formed on the connection surface of one chip is increasing, and therefore, the size of each individual electrode becomes smaller and the arrangement of electrodes becomes congested.

To deal with the steep increase in the number of electrodes in recent years, electrodes are formed on the outer-periphery of the connection surface of a chip 100 in an alternate arrangement pattern following zigzag peaks, as shown in FIG. 6(a).

The "alternate arrangement pattern following zigzag peaks" means a pattern wherein, as shown in FIG. 6(b), individual electrodes E (E1, E2) are located on each vertex point J1, J2 of a zigzag line (sawtooth waveform line) J shown with a dashed line. This arrangement pattern depicts a checker pattern in two rows as a whole, as shown in FIG. 6(a).

In the following, this arrangement pattern is also referred to as a "zigzag arrangement pattern".

The amplitude t2 (FIG. 6(a)) of the zigzag line in the zigzag arrangement pattern is determined in consideration of the size of electrodes, such that, as shown in FIG. 6(b), electrodes E1 located on one vertex point J1 do not contact electrodes E2 located on the other vertex point J2, even when transferred in the x-direction in the Figure.

The period (pitch) t1 of the zigzag line can be a short period, such that electrodes E1 located on one vertex point J1 come into contact with electrodes E2 located on the other vertex point J2 when they are transferred in the y-direction in the Figure, if the amplitude of the aforementioned zigzag line is determined with a sufficient room. The zigzag arrangement pattern is advantageous in that it permits setting of a short period.

The zigzag arrangement pattern of electrodes is used together with the stripe pattern of the wiring circuit board to be mentioned later, and enables fine pitch arrangement of electrodes and connection with the outside (e.g., JP-A-2003-249592).

On the other hand, as a technique for directly mounting a semiconductor element, a conductor part of a wiring circuit board is formed in a pattern corresponding to the positions of electrodes of a chip to afford mounting (bare chip mounting), directly connecting a chip with a wiring circuit board.

Figure 7:
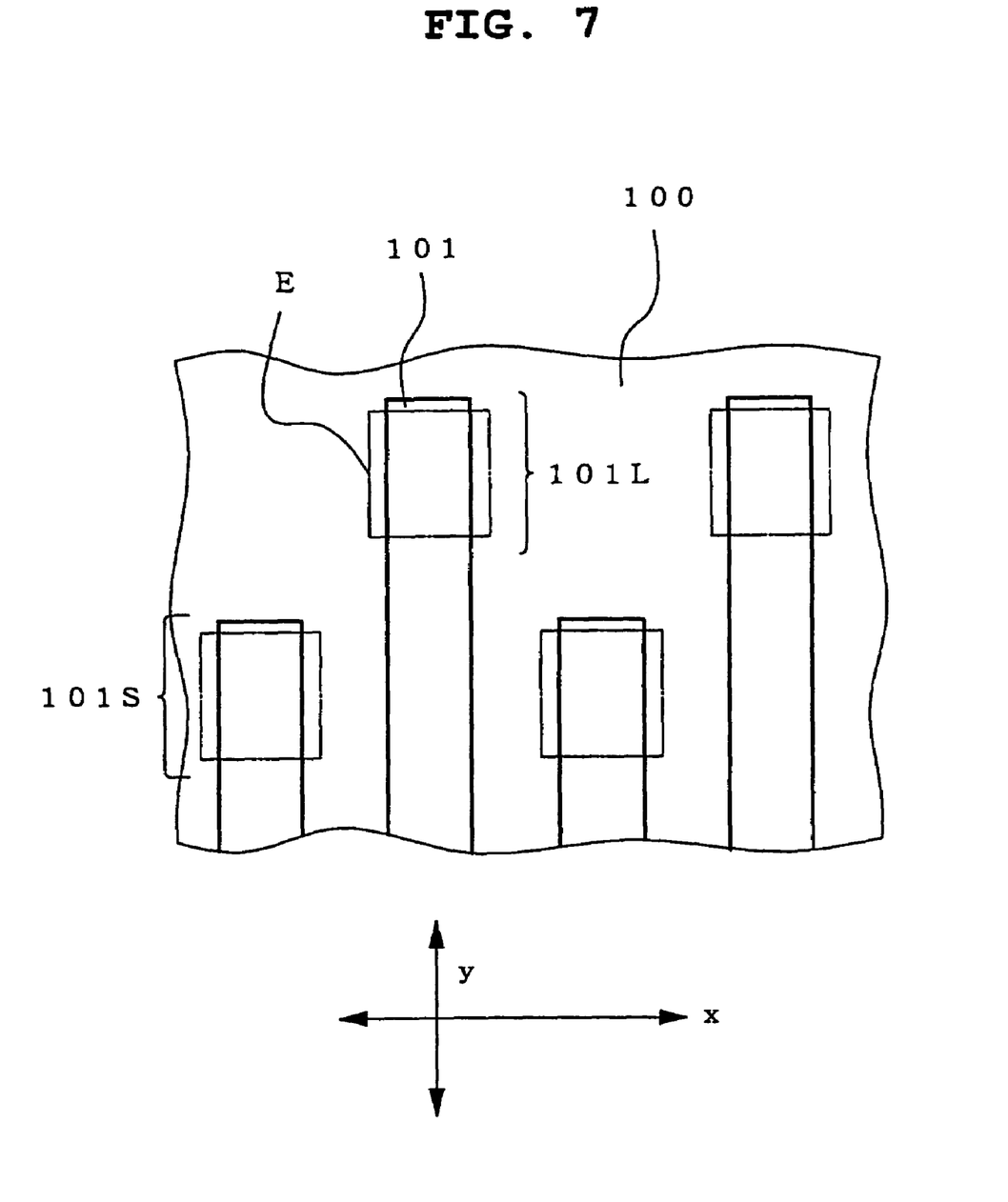
FIG. 7 shows a strip conductor in a stripe pattern corresponding to an electrode in a zigzag arrangement pattern of a conventional wiring circuit board.

The wiring circuit board to be used for the bare chip mounting has a structure, as shown in FIG. 7 as a topically enlarged embodiment, wherein a band-like conductor pattern 101 is formed on an insulating substrate 100. In the wiring circuit board, a strip conductor 101 is formed in exposure to make a stripe pattern in an area corresponding to electrodes E and involved in electrical connection with the electrodes when a chip is set, thereby allowing connection of conductors with respective electrodes (dashed line) E. In this stripe pattern, individual strip conductors 101 extend in the direction (direction shown with an arrow y in the Figure) about perpendicular to the advancing direction of the zigzag arrangement pattern of electrodes E (direction shown with an arrow x in the Figure).

Each strip conductor 101 becomes an end at the position corresponding to respective electrodes E, whereby the end of a stripe pattern contains long ends 101L and short ends 101S alternately arranged therein (e.g., FIGS. 1, 2 of JP-A-2003-249592 and the like).

The edge of the end of each strip conductor often ends slightly extending from electrodes E to be connected, as shown in FIG. 7.

Figure 8:
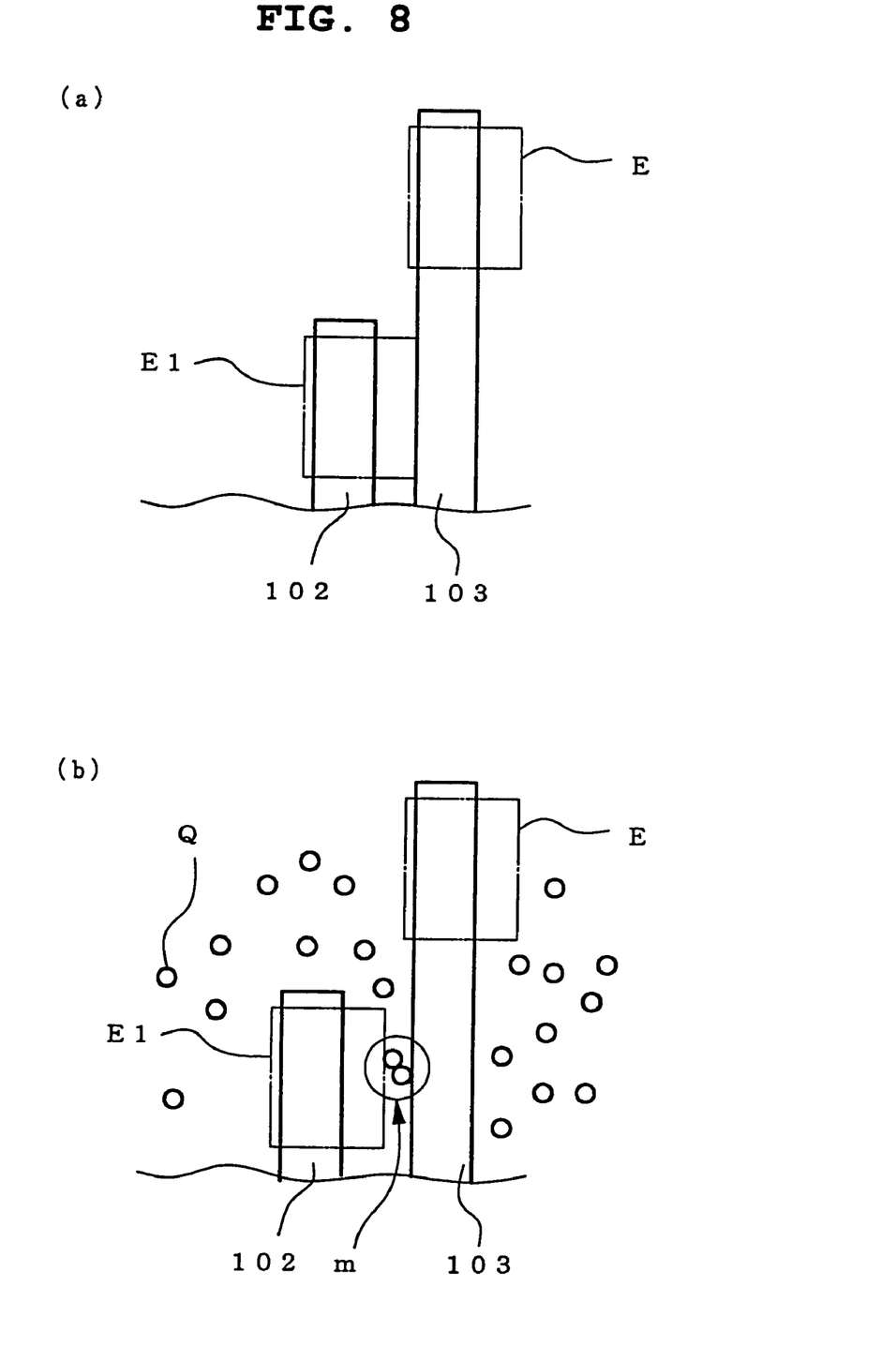
FIG. 8 shows a short circuit between an electrode and a strip conductor in chip mounting.

However, the present inventors investigated in detail the connection between an electrode formed in the above-mentioned zigzag arrangement pattern and a strip conductor formed in a stripe pattern, and found that, as shown in FIG. 8(a), positioning for mounting, and sizes of respective parts such as electrode width, conductor width and the like are required to have high precision, because electrodes E1 bridge to short-circuit two strip conductors 102 and 103 if the mounting position of a chip is deviated even a bit, making manufacture difficult.

In addition, it has been found that, when an anisotropic conductive adhesive comprising a conductive particle Q dispersed in a base material is used for connecting a chip with a wiring circuit board, as shown in FIG. 8(b), a conductive particle Q can be a short circuit path between an electrode E1 and a strip conductor 103, as shown by m in the Figure.

It is therefore an object of the present invention to provide a wiring circuit board having a structure capable of solving the above-mentioned problems, and to impart a wiring circuit board with a structure capable of suppressing a short circuit between an electrode and a wiring pattern even in the case of an electronic component having electrodes formed in high density and in a zigzag arrangement pattern.

SUMMARY OF THE INVENTION

The present invention has the following characteristics.
(1) A wiring circuit board for mounting an electronic component, which is characterized in that
an electronic component is to be mounted, which comprises plural electrodes formed on a connection surface thereof in an alternate arrangement pattern following zigzag peaks;
the wiring circuit board comprises a strip conductor formed in exposure and extending in a direction about perpendicular to an advancing direction of said zigzag, in a stripe pattern, so that an individual conductor can be connected to each electrode of an electronic component;
each strip conductor forms an end at a position corresponding to each electrode, thus the ends of the stripe pattern being formed by alternately arranged long ends and short ends; and
    at least the following part (A) is covered with a solder resist:
    (A) one section in the longitudinal direction of a strip conductor having a long end, which section comprises an area overlapping an electrode which is connected to a short end and transferred in parallel in the strip width direction up to the position on said strip conductor having a long end.
(2) The wiring circuit board of the above-mentioned (1), wherein each strip conductor is covered with a solder resist except an end involved in connection.

(3) The wiring circuit board of the above-mentioned (1), wherein each strip conductor and a substrate plane surrounding said conductor are covered with a solder resist except an end involved in connection.
(4) The wiring circuit board of the above-mentioned (1), wherein the electronic component to be mounted is a bare chip of a semiconductor element having a quadrate shape, and electrodes are formed in an alternate arrangement pattern following zigzag peaks on the outer periphery area of a connection surface of said bare chip.
(5) The wiring circuit board of the above-mentioned (4), wherein, when a bare chip is mounted on the wiring circuit board, a strip conductor pattern is formed on the outside of an area occupied by said bare chip, and an end of each strip conductor enters said occupied area and ends facing the center of said occupied area.
(6) The wiring circuit board of the above-mentioned (4), wherein, when a bare chip is mounted on said wiring circuit board, a strip conductor pattern is formed in the center of an area occupied by said bare chip, and each strip conductor ends at the periphery of said occupied area facing toward the outside of the area.
(7) The wiring circuit board of the above-mentioned (1), wherein each strip conductor formed to make a stripe pattern has a strip width of 5 μm–70 μm and a pitch of 20 μm–100 μm.

BRIEF DESCRIPTION OF THE DRAWINGS

FIG. 2 is a schematic showing of one embodiment of the wiring circuit board of the present invention, showing a wider range than FIG. 1, wherein FIG. 2(a) shows a substrate plane and FIG. 2(b) is a sectional view along A—A of FIG. 2(a).

In each Figure, the symbols indicate as follows: 1; insulating substrate, 2; strip conductor, 3; solder resist, L; long end, S; short end, E; electrode of chip.

DETAILED DESCRIPTION OF THE INVENTION

Figure 1:
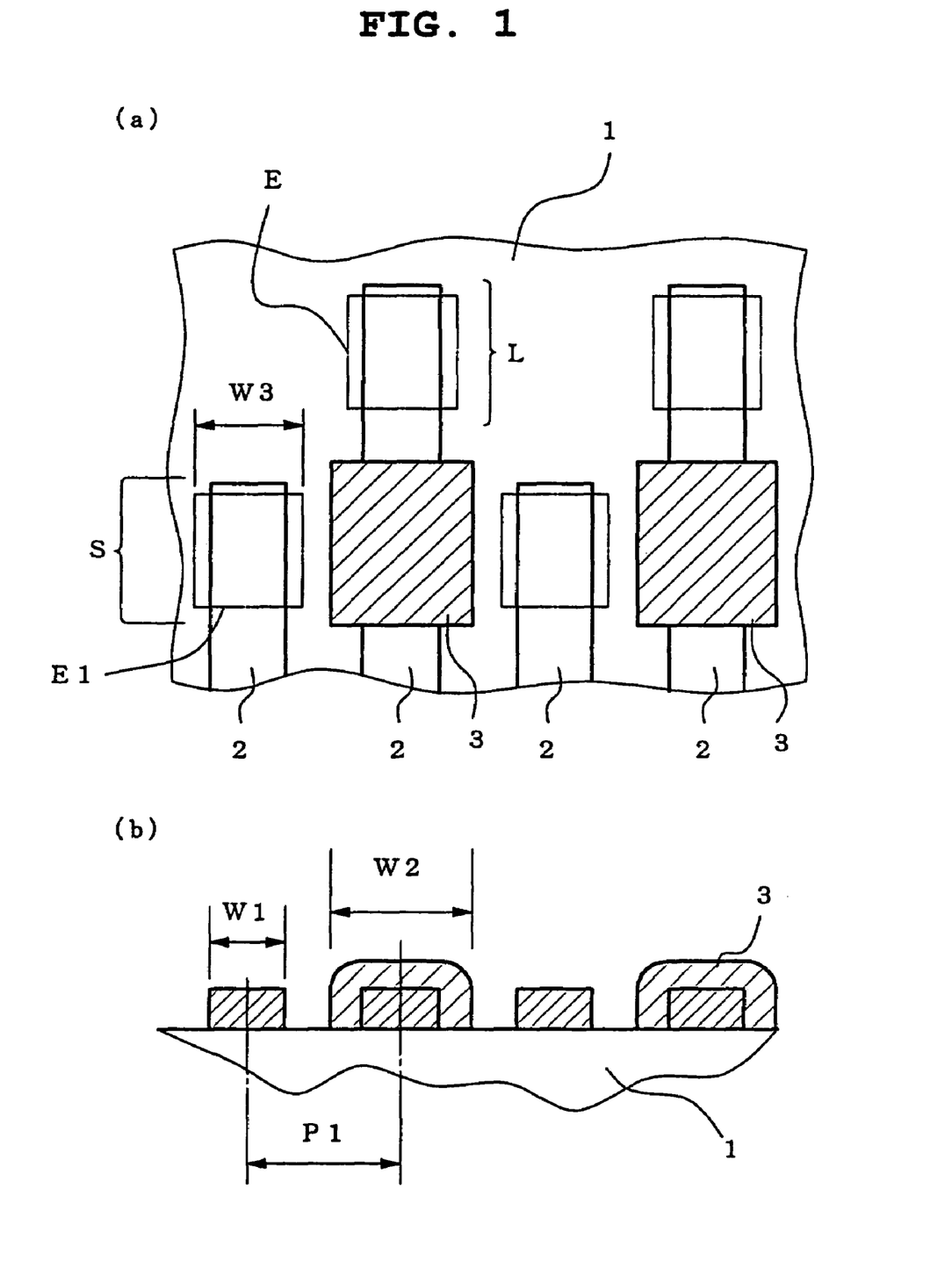
FIG. 1 is an enlarged view of a concerned part schematically showing one embodiment of the wiring circuit board of the present invention.

In the present invention, a solder resist 3 covers at least the above-mentioned (A) in an alternate pattern formed by long ends L and short ends S, as exemplarily shown in FIG. 1.

In the following, the above-mentioned (A) is also referred to as "part (A)" in the description of the present invention.

The wiring circuit board of the present invention is explained in detail by referring to a specific structure.

As shown in FIG. 1, one example of the structure of the wiring circuit board has a basic structure having a strip conductor 2 formed on an insulating substrate 1. This basic structure is the same as in the above-mentioned "BACKGROUND OF THE INVENTION" by referring to FIG. 7. An electronic component to be mounted on said wiring circuit board is the same as in FIG. 6 and has plural electrodes formed in a zigzag arrangement pattern on its connection surface.

The wiring circuit board includes an exposed strip conductor 2 extending in a direction about perpendicular to an advancing direction of the aforementioned zigzag to make a stripe pattern, so that an individual conductor can be connected to each electrode E. Each strip conductor 2 forms an end of a position corresponding to each electrode E, thus making long ends L and short ends S alternately arranged to form the stripe pattern.

The present invention is characterized by covering at least part (A) of the basic structure of a wiring circuit board with a solder resist 3. In the embodiment of FIG. 1, a solder resist covers part (A) and a small area of a substrate plane along the both sides thereof.

By covering at least part (A) with a solder resist, connection of electrodes E1 connected to short ends S to strip conductors 2 having long ends L is suppressed even when a deviation occurs during chip mounting.

As the electronic component to be mounted on the wiring circuit board, one having electrodes arranged in a fine pitch, high-density and in a zigzag arrangement pattern is suitable. Representative examples thereof include a bare chip of an integrated circuit such as IC, LSI and the like.

A typical bare chip generally has a quadrate shape for the outer periphery of a chip, and the size of one side is, though not limited to, generally about 0.5 mm–30 mm.

Figure 6:
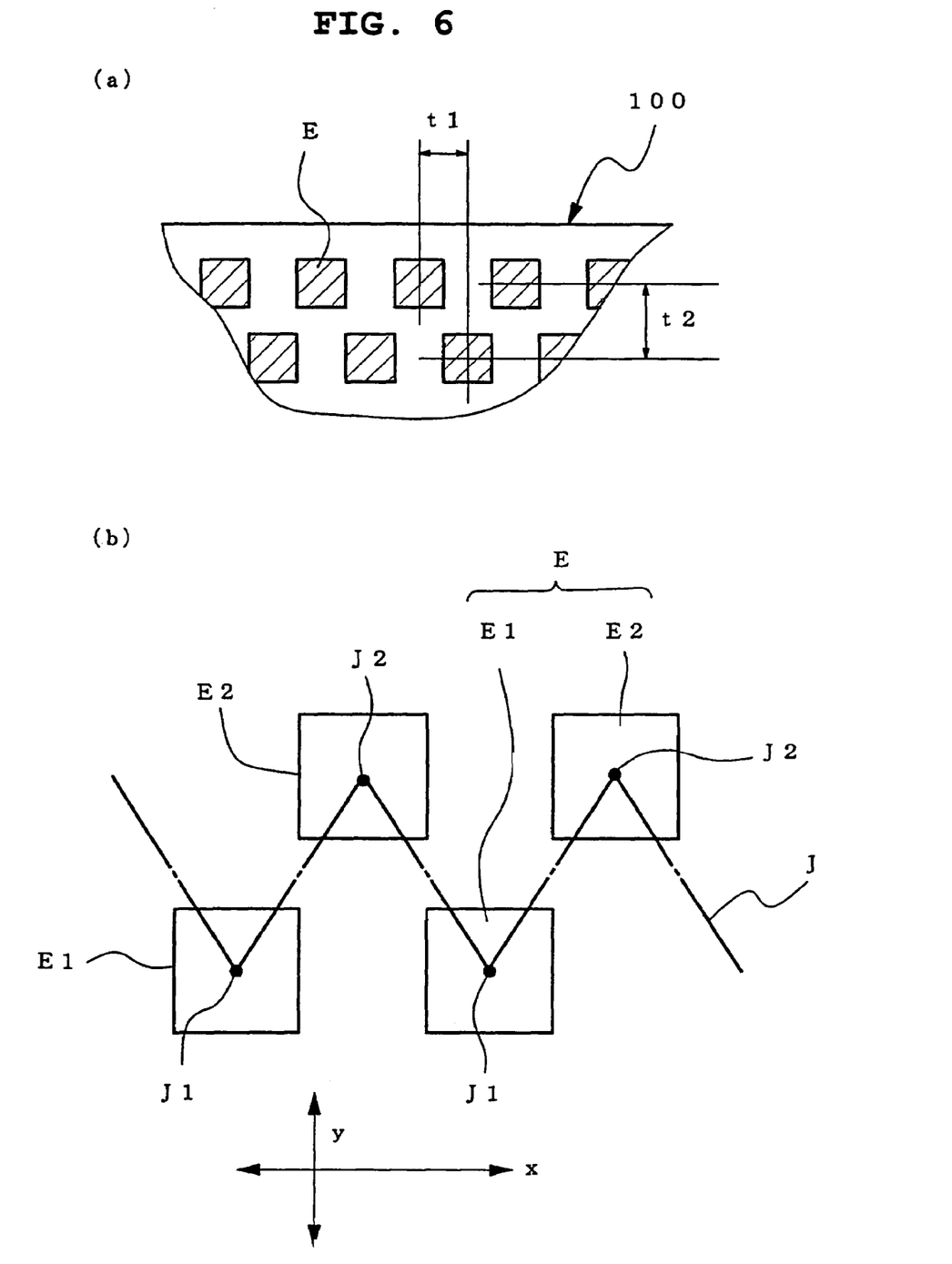
FIG. 6 explains an arrangement pattern of electrodes in the connection surface of a chip.

The electrodes formed on a bare chip are, as shown in FIG. 6, external terminals formed in a zigzag arrangement pattern on an outer periphery of a connection surface of a chip and the outer shape of the individual electrodes E is a quadrate shape (square or rectangle). While the size of one side of individual electrodes (W3 in FIG. 1) is not limited, in a high-density arrangement wherein said wiring circuit board is useful, it is generally about 15 μm–100 μm for one side.

The pitch t1 of the electrodes arranged in high-density as shown in FIG. 6 is about 20 μm–100 μm, particularly about 30 μm–100 μm, more particularly about 30 μm–60 μm, and the amplitude t2 of the zigzag arrangement pattern is generally about 50 μm–200 μm.

Where necessary, individual electrodes have a bump or a flat pad by gold plating and the like.

While the materials and thickness of the insulating substrate to be the base for forming a conductor pattern varies depending on the embodiment of said wiring circuit board, the materials of the insulating substrate include, for example, polyimide resin, polyester resin, epoxy resin, urethane resin, polystyrene resin, polyethylene resin, polyamide resin, acrylonitrile-butadiene-styrene (ABS) copolymer resin, polycarbonate resin, silicone-resin, fluorine resin and the like, and the thickness is about 10 μm–100 μm.

As shown in FIG. 1(b), the strip width W1 and pitch P1 of each strip conductor formed to constitute a stripe pattern vary depending on the size and pitch of the electrodes to be the connection object. In the case of the size of the above-mentioned electrodes, a useful strip width W1 is generally 5 μm–70 μm, particularly 10 μm–30 μm, and a useful pitch P1 is generally 20 μm–100 μm, particularly 30 μm–100 μm, more particularly 30 μm–60 μm.

The specific values of the strip width and pitch of strip conductor relative to electrodes may follow those of conventional art.

The material, constitution of single layer and multiple layers, and a method of forming a pattern of a strip conductor may follow those of conventional wiring circuit boards.

In which direction a stripe pattern ends may be the following (i) and/or (ii) according to the structure of said wiring circuit board.

(i) an embodiment wherein, when a chip is mounted, a pattern of a strip conductor is formed on the outside of the area occupied by said chip, the end enters said occupied area and the pattern ends facing the inside of the area (center).

(ii) an embodiment wherein, when a chip is mounted, a pattern of a strip conductor is formed in the center of the area occupied by said chip, the strip conductor ends at the periphery of the occupied area facing toward the outside of the occupied area.

Figure 2:
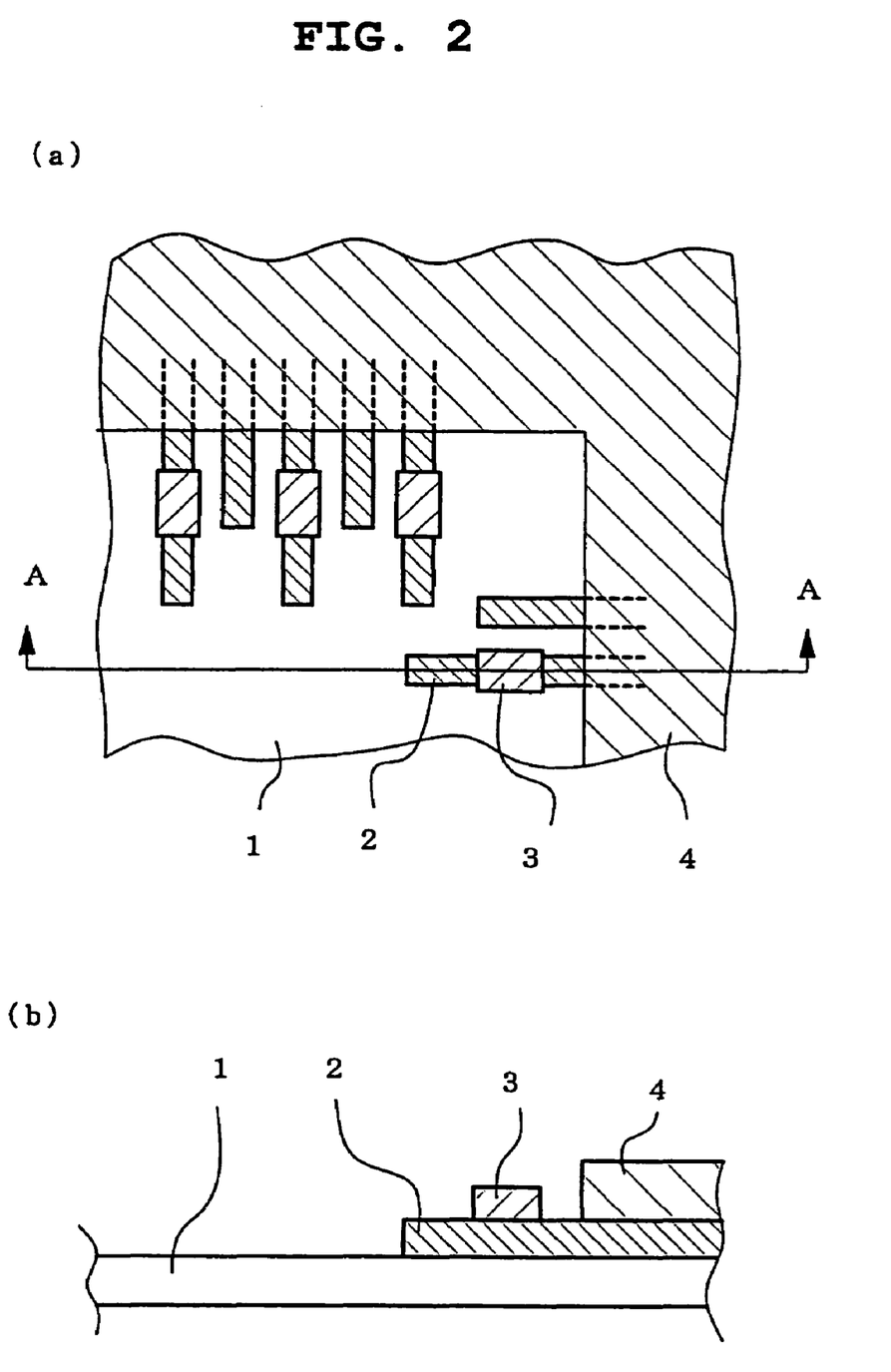

One example of the basic material constitution of a wiring circuit board is shown in FIG. 2, wherein a pattern of a strip conductor 2 made of copper is formed on a film substrate 1 made of polyimide, and said strip conductor on an end to be connected to electrodes is coated with a connection metal (not shown) such as gold, nickel, tin and the like. In addition, the part other than the whole area where the strip conductor is an end of a stripe pattern is preferably covered with cover lay 4 made of polyimide and the like.

A method of forming a pattern of a strip conductor may be an additive forming method comprising adding a conductor metal to a substrate plane while forming a pattern, or a subtractive forming method comprising forming a uniform conductor metal layer on a substrate plane and removing an area other than the necessary pattern.

The solder resist to be used in the present invention is an insulating layer formed to cover the area other than the IC mounting part and electrodes, so as to cover wiring pattern such as strip conductor and the like for protection of the wiring pattern.

The material of the solder resist may be a conventional one, such as silicone resin, epoxy resin, polyimide resin and the like.

The average film thickness of the solder resist varies depending on the film forming process. For prevention of a short circuit, it is preferably about 5 µm–30 µm, particularly 10 µm–20 µm.

As a method to form a solder resist as a coating covering a predetermined part, a method of applying a liquid type resist to a predetermined part, a method of adhering a film-like sheet separately formed to a predetermined part and the like can be mentioned.

As a method to form a solder resist in a predetermined pattern, screen printing, patterning by exposure and development using a photosensitive solder resist and the like can be mentioned.

As mentioned above, in the embodiment of FIG. 1, part (A) and a small area of a substrate plane along the both sides thereof are covered with a solder resist, and topical application of this solder resist provides an appearance absent in conventional wiring circuit boards.

Figure 3:
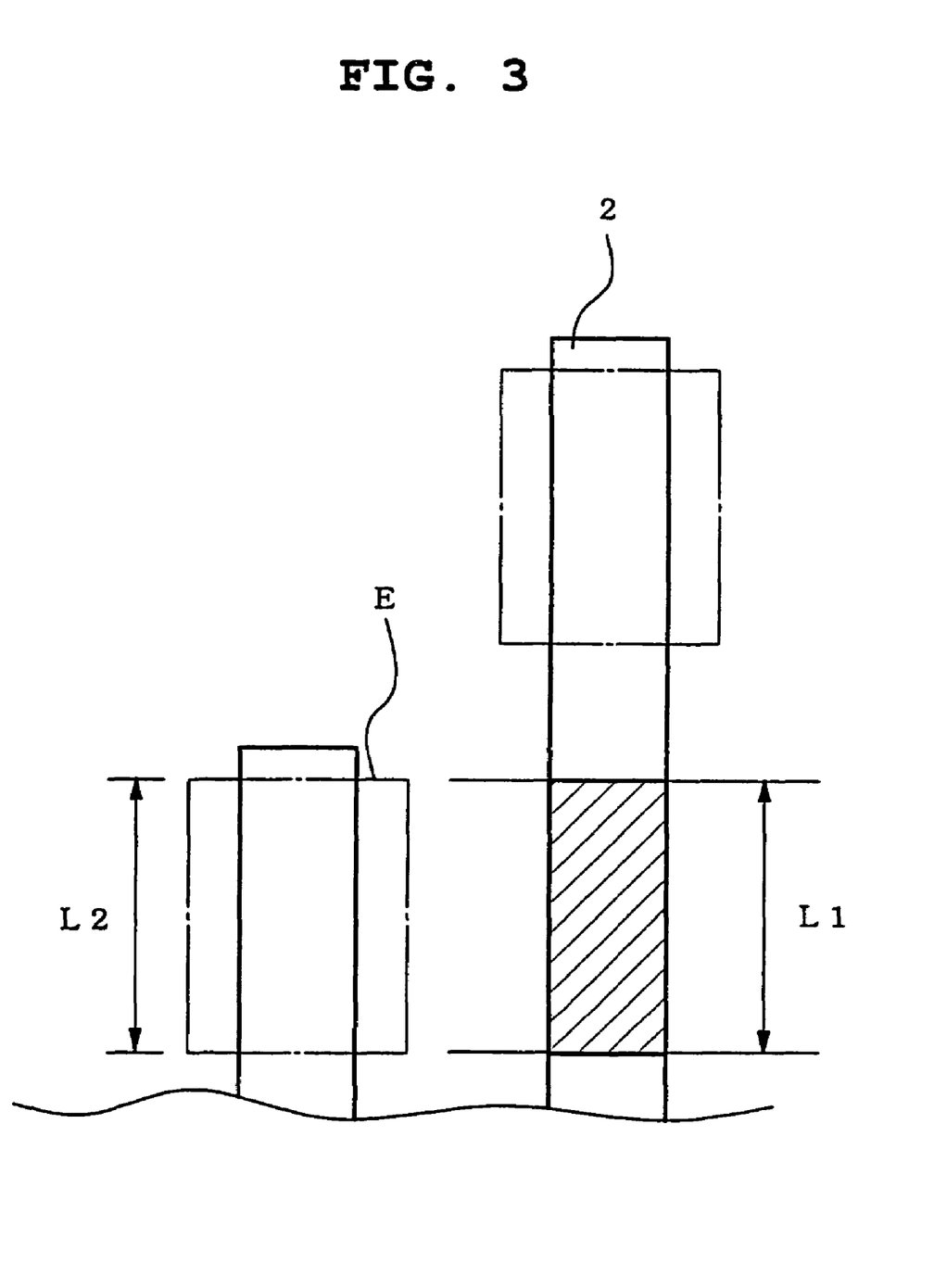
FIG. 3 explains (A) in the present invention.

FIG. 3 is a schematic view showing the size and position of part (A), wherein part (A) of strip conductors having long end is hatched.

The term "including" in the definition of the above-mentioned (A), "comprises an area overlapping an electrode which is connected to a short end and transferred in parallel in the strip width direction up to the position on said strip conductor having a long end" also means being the same.

As shown in FIG. 3, the size L1 of part (A) in the longitudinal direction (direction of extension of strip conductor) is determined according to the size L2 of the electrodes E in the longitudinal direction, which is connected to a short end S, wherein $L1 \geqq L2$, preferably $L1 \geqq L2$.

In addition, as shown in this Figure, the position of part (A) is such a position corresponding to electrode E, when the electrodes E is connected to the adjacent short end S and the electrodes are slid in the strip width direction of a strip conductor. As a result, a short circuit is effectively suppressed.

In consideration of inconsistent positioning during chip mounting, manufacture error in the size of electrode, disorder in connection of an electrode to a long end and the like, the size L1 of part (A) in the longitudinal direction is preferably greater than L2 only by 0.1 µm–50 µm, particularly 5 µm–20 µm.

The center of part (A) may be any as long as it is a position where the center of electrodes E to be connected to the adjacent short end S is slid to the strip conductor in the width direction. Alternatively, it may have an error within the range free of adverse influence on other electrodes and permitting achievement of the object of the present invention.

In the embodiment of FIG. 1, part (A) and a small area of a substrate plane along the both sides thereof are covered with a solder resist. The width (the same direction as strip conductor width) W2 of the solder resist can be determined as appropriate in consideration of width W1 of the strip conductor, pitch P1 of the stripe and the width W3 of the electrodes E, so as not to prevent connection between short end S and electrodes E.

In the present invention, areas other than part (A) may be covered freely as long as it is not a terminal involved in the connection with electrodes.

Figure 4:
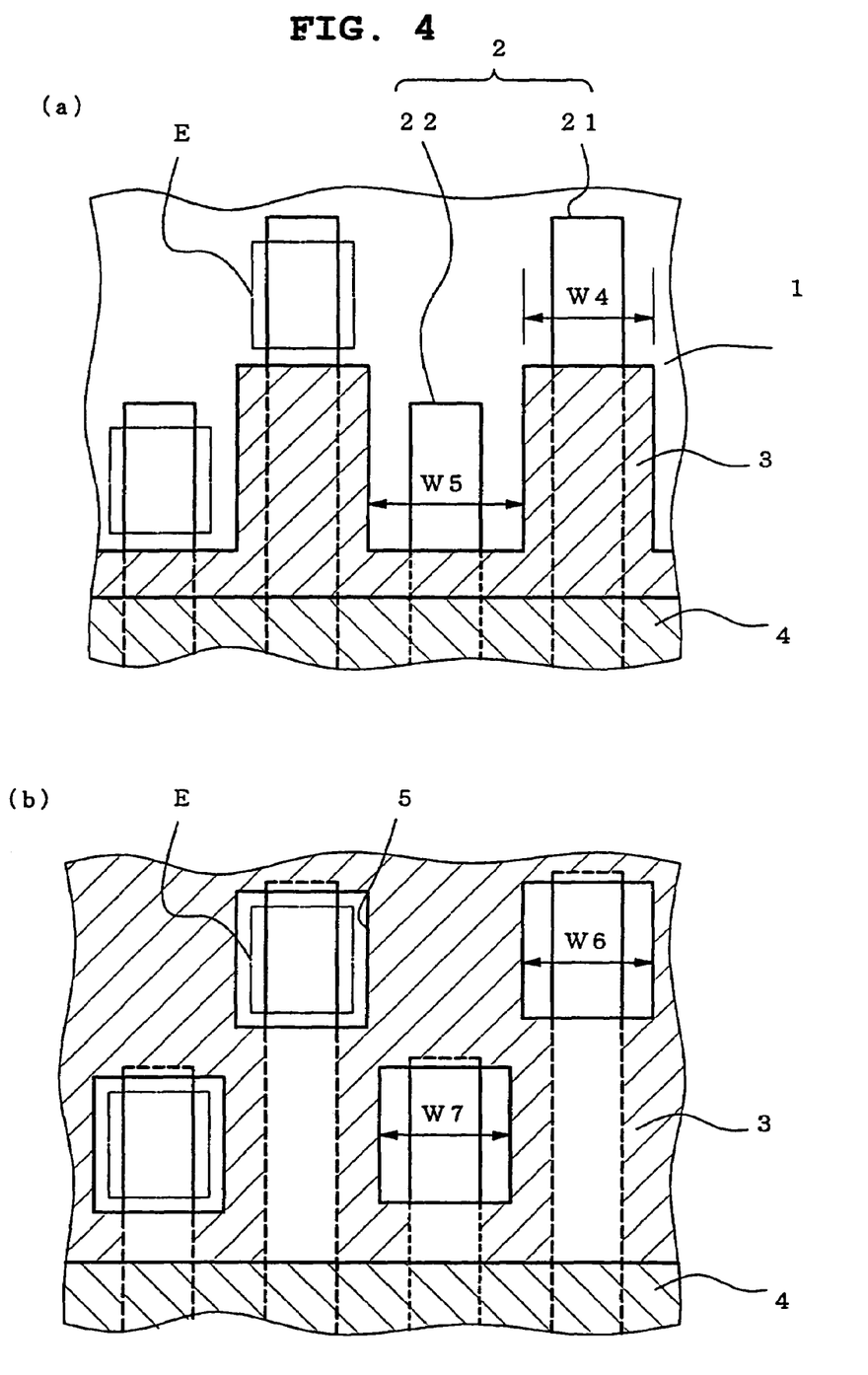
FIG. 4 is a schematic showing of another embodiment of the wiring circuit board of the present invention.

In the embodiment shown in FIG. 4(a), only an end involved in the connection with electrodes E is exposed and strip conductor 2 other than that is covered with solder resist 3. As shown in FIG. 4(a), the border line of solder resist on a substrate plane is a rectangular wave shape and provides an appearance not seen in conventional wiring circuit board, as in the embodiment of FIG. 1.

In this Figure, the layer shown with a number 4 is, as also shown in FIGS. 2(a), (b), a cover lay to cover a conductor pattern other than the stripe involved in the connection. The solder resist 3 in the embodiment of FIG. 4(a) covers the end of cover lay 4.

In the embodiment of FIG. 4(a), the width (width of convex part of concavo-convex pattern) W4 of solder resist 3 covering strip conductor 21 having a long end, and the width (width of concavo part of concavo-convex pattern) W5 of solder resist 3 covering strip conductor 22 having a short end, may both follow width W2 of solder resist 3 in the embodiment of FIG. 1 and the items to be considered for determining the value are the same.

In the embodiment shown in FIG. 4(b), a strip conductor, substrate plane (except the area covered with cover lay 4) is covered with solder resist 3, such that only the end involved in the connection with electrodes E is exposed from a window opening 5.

The size of the opening 5 in the embodiment of FIG. 4(b) is preferably the size of an outer periphery plus a margin in consideration of the size of electrodes to be connected, error and positioning error. The widths (the same direction as strip conductor width) W6, W7 of each opening 5 may both follow widths W4, W5 of solder resist 3 in the embodiment of FIG. 4(a).

EXAMPLE

In this Example, a wiring circuit board of the embodiment shown in FIG. 4(a) was actually manufactured and connection to a chip was evaluated along with Comparative Example free of a solder resist (Specification of Chip)

The chip to be the connection object is an LSI chip obtained by forming an integrated circuit on a silicon wafer and dicing into elements, which has a thickness of 550 μm and a rectangle having an outer shape of 2 mm×18 mm.

Electrode E is located highly densely in a zigzag arrangement pattern on an outer periphery of a connection surface of a chip, as shown in FIG. 6(a). The shape of the electrode is a rectangle of 40 μm×63 μm longer in the center direction of a connection surface and has Au bumps on the surface.

The pitch t1 of zigzag arrangement pattern of electrodes is 40 μm, and the amplitude t2 of the zigzag arrangement pattern is 93 μm.

(Formation of Wiring Circuit Board)

A metal thin film is formed on a polyimide film substrate having a thickness of 25 μm by sputtering according to a semiadditive method, and a conductor pattern (pattern total thickness 12 μm) for external connection and a stripe pattern (pattern total thickness 12 μm) involved in the connection area were formed thereon. Then, the area other than the area involved in the connection was entirely covered with a cover lay having a thickness of 10 μm, which was made of polyimide and the like. Then, Ni (lower layer)/Au (upper layer) was formed as a metal coating for connection on each end to be connected to an electrode of a chip by electroless plating.

(Application of Solder Resist)

As shown in FIG. 4(a), a solder resist is applied to the stripe pattern of a strip conductor having a long end and a short end and exposed from the cover lay, in the thickness of 15 μm in a pattern forming a border line of a rectangular wave, such that each strip conductor has a 80 μm protrusion, whereby a wiring circuit board (Example product) of the present invention was obtained.

(Process of Forming Solder Resist)

First, an epoxy solder resist was screen printed, dried, exposed, developed and cured at 150° C. for 30 min with an opening of an area where a chip is to be mounted, whereby a solder resist of an object pattern was formed.

(Comparative Example Product)

In the same manner as in the above-mentioned Example except that a solder resist was not formed, a wiring circuit board was manufactured and used as a Comparative Example product (i.e., conventional product).

(Mount Evaluation)

The Example product and Comparative Example product were prepared (100 each). A chip was mounted for each and deviation of a chip in the width direction relative to the strip conductor, and incidence of short circuit failure between electrode and adjacent strip conductor were examined.

Figure 5:
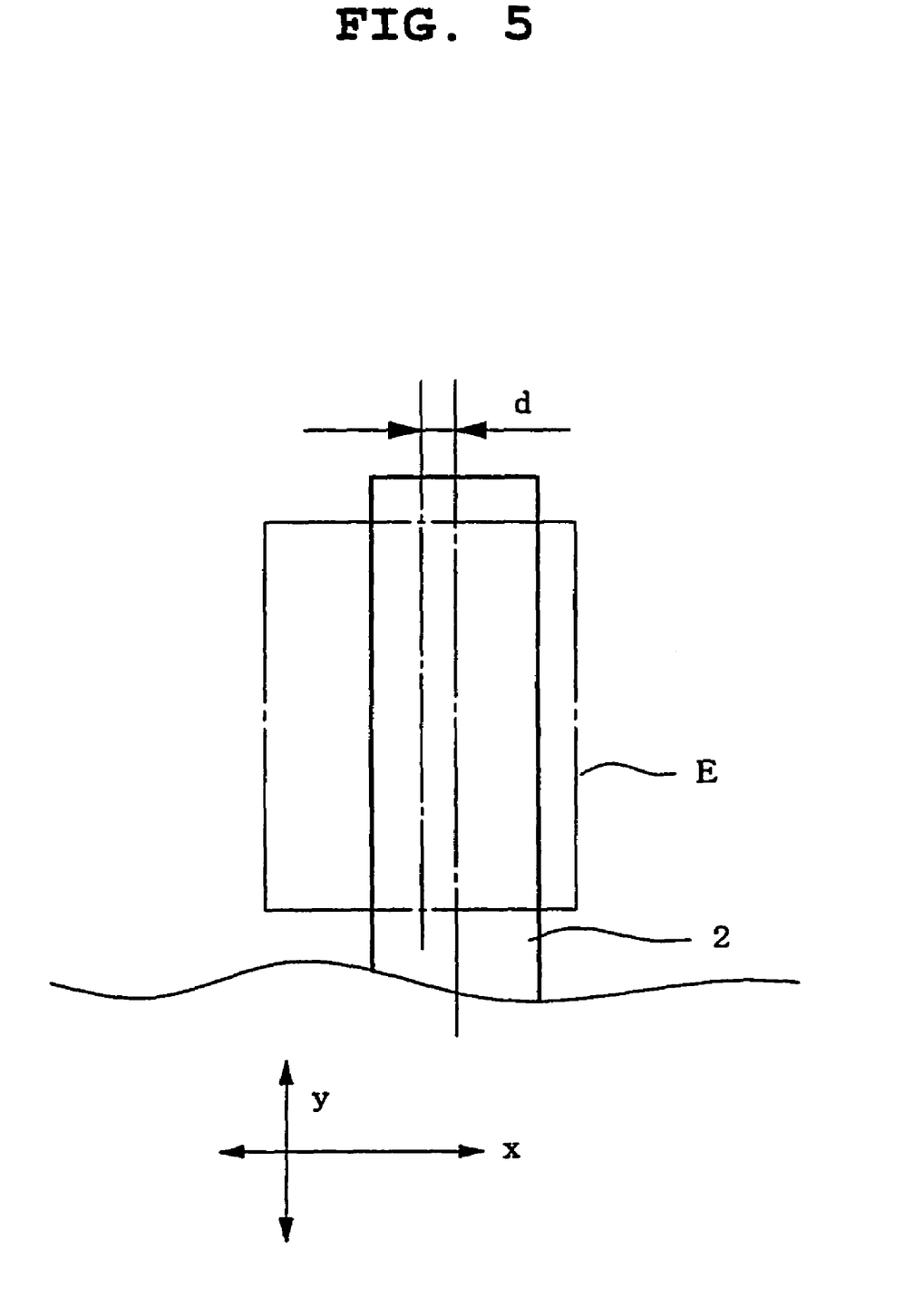
FIG. 5 explains a deviation value in the width direction of a chip relative to a strip conductor in chip mounting.

The deviation of a chip in the width direction relative to the strip conductor means, as shown in FIG. 5, a difference d in the x-direction between the center of the width of strip conductor 2 and the width of electrodes E (size of-strip conductor in the same direction as the width), which is mainly a positioning error but also contains small positional errors in patterning and manufacture of electrode itself.

For mounting, an anisotropic conductive film (Hitachi Chemical Co., Ltd., thickness 40 μm, containing conductive particles having an average particle diameter of 3–5 μm dispersed in the film) was located between the chip and the wiring circuit board.

As a mounting apparatus, a flip chip bonder (FB30T, Kyushu Matsushita Electric Co., Ltd., 2002 model) was used, and a bonding tool temperature was set to 280° C. (set value), bonding time was set to 15 sec, bonding load per chip was set to 30 kgf and stage temperature was set to 60° C.

When a chip having the above-mentioned shape and size is mounted using the above-mentioned flip chip bonder by conventional technique, a deviation value of 2 μm means almost no deviation and the positioning on mounting can be evaluated to be extremely fine, a deviation value of 5 μm means slight deviation but less incidence of short circuit failure, and a deviation value 8 μm means certain occurrence of deviation and high possibility of incidence of short circuit failure.

From the mounted samples, those having a deviation value of 2 μm, 5 μm or 8 μm were selected, and the presence of a short circuit failure was confirmed. As a result, the relationship between the deviation value and the incidence of short circuit failure was as shown in the following Table 1.

TABLE 1

|  | Deviation value (μm) and incidence (%) of short circuit failure | | |
| --- | --- | --- | --- |
|  | 2 μm | 5 μm | 8 μm |
| Example product | 0% | 0% | 0% |
| Comparative Example product | 0% | 30% | 70% |

As is clear from the results shown in Table 1, the Comparative Example product having a conventional structure suffered from occurrence of a short circuit failure in 30% at 5 μm deviation value, but Example product was free of a short circuit failure, and even at a deviation value of 8 μm, the Example product was free of a short circuit failure.

From the above-mentioned results, it is clear that a short circuit failure can be prevented even at a considerably high deviation value.

From the foregoing explanation, the use of a wiring circuit board of the present invention markedly reduced the incidence of short circuit failure during mounting even in the case of a chip equipped with electrodes formed in a fine pitch, high-density and a zigzag arrangement pattern.

This application is based on patent application No. 2003-418157 filed in Japan, the contents of which are hereby incorporated by reference.

What is claimed is:

1. A wiring circuit board for mounting an electronic component, which is characterized in that
an electronic component is to be mounted, which comprises plural electrodes formed on a connection surface thereof in an alternate arrangement pattern following zigzag peaks;
the wiring circuit board comprises a strip conductor formed in exposure and extending in a direction about perpendicular to an advancing direction of said zigzag, in a stripe pattern, so that an individual conductor can be connected to each electrode of an electronic component;

each strip conductor forms an end at a position corresponding to each electrode, thus the ends of the stripe pattern being formed by alternately arranged long ends and short ends; and at least the following part (A) is covered with a solder resist:

(A) one section in the longitudinal direction of a strip conductor having a long end, which section comprises an area overlapping an electrode which is connected to a short end and transferred in parallel in the strip width direction up to the position on said strip conductor having a long end.

2. The wiring circuit board of claim 1, wherein each strip conductor is covered with a solder resist except an end involved in connection.

3. The wiring circuit board of claim 1, wherein each strip conductor and a substrate plane surrounding said conductor are covered with a solder resist except an end involved in connection.

4. The wiring circuit board of claim 1, wherein the electronic component to be mounted is a bare chip of a semiconductor element having a quadrate shape, and electrodes are formed in an alternate arrangement pattern following zigzag peaks on the outer periphery area of a connection surface of said bare chip.

5. The wiring circuit board of claim 4, wherein, when a bare chip is mounted on the wiring circuit board, a strip conductor pattern is formed on the outside of an area occupied by said bare chip, and an end of each strip conductor enters said occupied area and ends facing the center of said occupied area.

6. The wiring circuit board of claim 4, wherein, when a bare chip is mounted on said wiring circuit board, a strip conductor pattern is formed in the center of an area occupied by said bare chip, and each strip conductor ends at the periphery of said occupied area facing toward the outside of the area.

7. The wiring circuit board of claim 1, wherein each strip conductor formed to make a stripe pattern has a strip width of 5 μm–70 μm and a pitch of 20 μm–100 μm.

* * * * *